United States Patent [19]

Tanielian

[11] Patent Number: 4,931,353
[45] Date of Patent: Jun. 5, 1990

[54] STRUCTURE AND METHOD FOR SELECTIVELY PRODUCING A CONDUCTIVE REGION ON A SUBSTRATE

[75] Inventor: Minas H. Tanielian, Bellevue, Wash.

[73] Assignee: The Boeing Company, Seattle, Wash.

[21] Appl. No.: 440,766

[22] Filed: Nov. 22, 1989

Related U.S. Application Data

[62] Division of Ser. No. 317,739, Mar. 1, 1989.

[51] Int. Cl.⁵ .......................................... H01L 21/283
[52] U.S. Cl. ..................... 437/200; 437/190; 437/192; 437/922; 437/246; 148/DIG. 55; 148/DIG. 90; 148/DIG. 93; 357/71
[58] Field of Search ............... 357/715; 437/200, 201, 437/922, 17, 190, 192, 195, 174, 173; 148/DIG. 55, DIG. 90, DIG. 93

[56] References Cited

U.S. PATENT DOCUMENTS

4,681,778  7/1987  Young .......................... 437/246 X
4,751,197  6/1988  Wills .......................... 148/DIG. 55

FOREIGN PATENT DOCUMENTS

0152250  11/1981  Japan ................................ 437/246

OTHER PUBLICATIONS

Song, Jerng-Sik, et al., "Enhanced PtSi formation...", Appl. Phys. Lett. 50(7), 16 Feb. 1987, pp. 422-424.

Primary Examiner—Brian E. Hearn
Assistant Examiner—T. N. Quach
Attorney, Agent, or Firm—Christensen, O'Connor, Johnson & Kindness

[57] ABSTRACT

In a multi-chip module, a structure for selectively connecting two conductors. A switchable connector (36) is disposed between a first and second portion (30,32) of a copper conductor (28). The switchable connector comprises an amorphous silicon layer (58), which extends between two spacer pads (56) that are electrically connected to the first and second portions of the copper conductor. A barrier layer (60) is formed atop the amorphous silicon, physically separating it from a reactive metal layer (62). The reactive metal layer is coated with an antireflective coating (64). Interaction of the reactive metal layer with the amorphous silicon layer is prevented by the barrier layer until the barrier layer is heated above 500° C. A laser beam (66) is focused on opposite edges of the switchable connector, causing the barrier layer and reactive metal layer to diffuse into the amorphous silicon, forming electrically conductive silicides. Electric current can then flow between the first and second portions of the copper conductor through the silicides and the remainder of the reactive metal layer.

10 Claims, 2 Drawing Sheets

STRUCTURE AND METHOD FOR SELECTIVELY PRODUCING A CONDUCTIVE REGION ON A SUBSTRATE

This is divisional of the prior application Ser. No. 07/317,739, filed Mar. 1, 1989. The benefit of the filing date of which is hereby claimed under 35 U.S.C. §120.

TECHNICAL FIELD

This invention generally pertains to a method and structure for providing a conductive path between conductors in a multi-chip module, and particularly, is directed to a method and structure for selectively electrically connecting two conductors in internal signal layers of a substrate by locally heating a nonconductive site, converting it to a conductive state.

BACKGROUND OF THE INVENTION

High-density multi-chip modules containing many integrated circuits (ICs) are typically produced using photolithographic masks to define the circuit. The component ICs on the substrate are interconnected using conductive traces only about 10 μm wide, which are disposed on multiple conductive signal planes. The production of high-density multi-chip modules, especially those with finer traces, is prone to defects arising either during the fabrication of the multi-chip module layers or during the final assembly of the module. Interconnection of all elements comprising the circuit must be correctly defined by the masks and fabricated without defects to achieve proper operation of the device.

Although the prior art does not include a method for making substantial modifications to the circuit design of a multi-chip module *following its assembly*, various repair schemes have been developed to correct minor defects in exposed conductors detected during the fabrication of a conductor/dielectric signal layer. For instance, a break in a conductive trace in an exposed signal layer can be bridged by the localized deposition of a metal, such as tungsten, using a laser or focused ion beam. Similarly, short circuits can be corrected by blowing off unwanted metal, again using a laser or a focused ion beam. If the defects are too numerous or too large, it may be more practical to scrap the substrate, since repair would be too costly.

When defects arise in the signal layers during the final processing steps or during the assembly stage of the multi-chip module, repair of the module becomes more cost effective. In this case, a method is required that can effect repairs by rerouting the defective conductor sections through alternate (redundant) conductor paths that may lie *buried* under other signal layers. Circuit rerouting can be achieved by the use of switchable connections, which are formed during the fabrication of the signal layers and remain nonconductive until activated by a laser. A repair method that uses switchable connectors (and switchable disconnectors) is disclosed in co-pending, commonly assigned U.S. patent application Ser. No. 07/321,911, entitled, INTEGRATED CIRCUIT HAVING REROUTABLE CONDUCTIVE PATHS. The switchable connections are one-time fusible links, which effect a permanent change in the circuit when activated. The switchable connections must be process compatible (i.e., they cannot be accidentally switched by any of the processing steps or procedures during the fabrication of any of the layers) on the substrate and also should be insensitive to rework procedures at a neighboring site. Such switchable connections are not limited to repair of defects, but can also be used to modify the design of a circuit defined on a substrate.

Methods and structures for modifying a conductive path within a substrate have been developed in the prior art. For example, a selectively switchable connection between conductors on a substrate and a method for making such a connection are disclosed in U.S. Pat. No. 4,681,778. This patent teaches that a nonconductive film formed of spaced apart metal columns or islands can be deposited between two conductors on the substrate of a silicon chip. Since the metal columns are not in electrical contact with each other, the film acts like a dielectric. Whenever it is desired to change the film from a nonconducting to a conducting state in order to provide electrical continuity between the two conductors, a laser beam is locally focused on the film, melting the metal columns so that they fuse together, thereby creating a conductive path.

In order to assure that full continuity between the two conductors is achieved, *all* the metal columns along a *continuous* path between the conductors must be melted by the laser beam. This may require multiple scans of the film with the laser beam. In addition, if several conductors that include regions of the dielectric film are closely spaced, care must be taken to avoid scanning the laser onto an adjacent region, where it may melt other columns, creating an undesired continuity between other conductors. Furthermore, the integrity of a polymeric dielectric material used as an intermetallic insulator in the device may be locally compromised due to excessive heating during the process of fusing the metal columns.

In consideration of the foregoing problems, it is an object of the present invention to selectively produce electrical continuity between two conductors disposed internally within an insulating coating, on a multi-chip module substrate or in other types of ICs. It is a further object to provide a structure and method for selectively connecting two conductors by localized heating of a very small region adjacent each conductor. Yet a further object is to selectively change a nonconducting region separating two conductors to a conducting state without significant change in the volume at the site. Another object of this invention is to effect this change without compromising the integrity of the insulating overlayer present. Yet another object of this invention is to provide a switchable link that is optically tuned so as to have minimum reflectivity at a specified laser wavelength. These and other objects and advantages of the present invention will be apparent from the attached drawings and the Disclosure of the Preferred Embodiments that follow.

SUMMARY OF THE INVENTION

In accordance with the present invention, a structure is provided for selectively creating electrical continuity between two spaced apart conductors formed on a substrate. The structure includes a layer of silicon deposited on the substrate between the two conductors, and a barrier layer of a metallic material deposited on the layer of silicon. The metallic material chosen for the barrier layer is chemically nonreactive with silicon and does not diffusably mix with it below an elevated reaction temperature. The silicon layer separates the barrier layer from the two conductors, preventing it from providing electrical continuity between the conductors.

A layer of electrically conductive material that is chemically reactive with silicon at a temperature substantially below the reaction temperature is deposited on the barrier layer. The barrier layer thus separates the layer of electrically conductive material from the layer of silicon, preventing it from reacting with the silicon. To change the structure from an electrically nonconductive state to an electrically conductive state, the layers of the conductive material and the metallic material are heated above the reaction temperature, causing the conductive material and metallic material to diffuse into and react with the silicon, forming conductive silicides. The conductive silicides provide electrical continuity between the two conductors through the layer of conductive material.

Selective localized heating of the layer of electrically conductive material and the barrier layer is accomplished using a focused beam of energy. An antireflective coating is deposited over the layer of electrically conductive material to substantially absorb the focused beam of energy, preventing its reflection. The antireflective coating preferably comprises silicon, which reacts with the conductive layer to become relatively rough and nonreflective. The focused beam of energy may preferably comprise a laser beam.

In the structure described above, the conductive material is selected from the group consisting of platinum, palladium, nickel, and aluminum. Further, the barrier layer of metallic material preferably comprises titanium.

A transparent insulating material overlying the layer of conductive material is cured at a temperature well below the reaction temperature. The transparent insulating material preferably comprises polyimide.

A method including steps generally implementing the functions of the elements of the structure comprises a further aspect of this invention.

DISCLOSURE OF THE PREFERRED EMBODIMENTS

Figure 1:
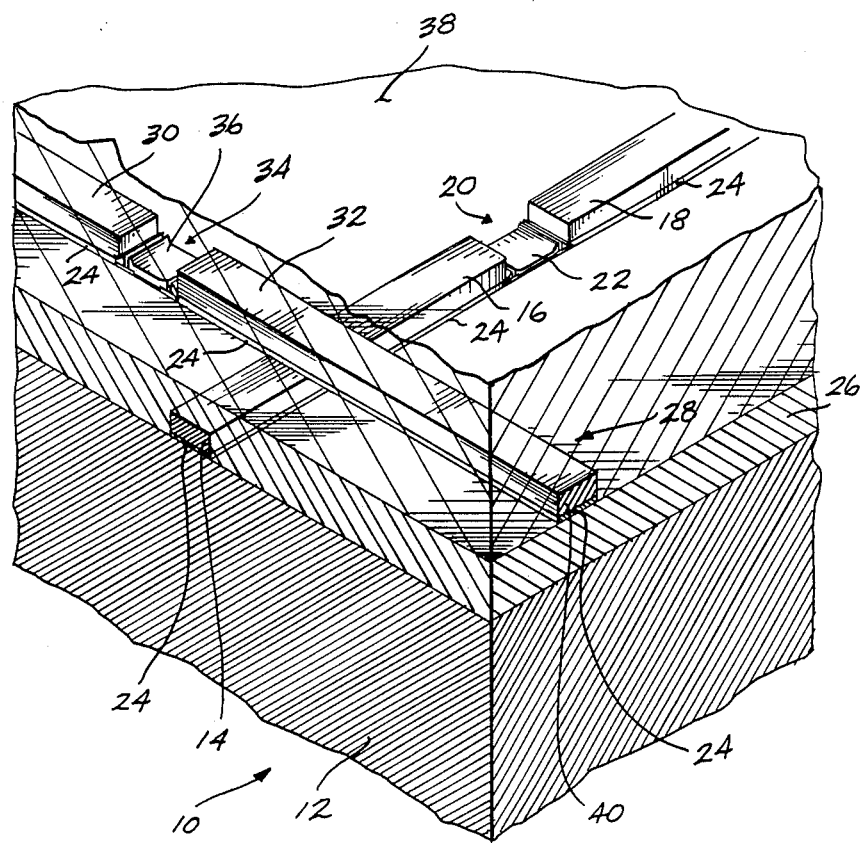
FIG. 1 is an isometric view of a portion of a multi-chip module showing two conductors that include the structure of the present invention for selectively providing electrical continuity.

Referring to FIG. 1, a multi-chip module incorporating a plurality of structures for selectively providing electrical continuity between conductors is indicated generally at reference numeral 10. Only a very small portion of the multi-chip module 10 is shown to simplify an explanation of how the present invention is incorporated in such a circuit.

Multi-chip module 10 includes a silicon substrate 12 on which a copper conductor 14 is deposited by electroplating on a plating base 24, which is formed using conventional vacuum deposition and mask etching/photoresistant techniques. Copper conductor 14 includes a first portion 16 and a second portion 18 aligned along a common longitudinal axis and separated by a gap 20. Within gap 20 is disposed a switchable connector 22, which is normally in a nonconductive state so as to interrupt electrical continuity between first portion 16 and second portion 18 of copper conductor 14.

Similarly, a copper conductor 28 is formed on plating base 24, and its longitudinal axis is generally aligned transversely to the longitudinal axis of copper conductor 14. A transparent dielectric layer 26 separates the plating base of copper conductor 28 from the top of copper conductor 14. Copper conductor 28 is divided into a first portion 30 and a second portion 32 by a gap 34, in which is disposed a switchable connector 36. An insulating coating 38 is applied over copper conductor 28, and comprises an organic material (preferably polyimide), which is transparent to light of a predetermined range of wavelengths.

Figure 2:
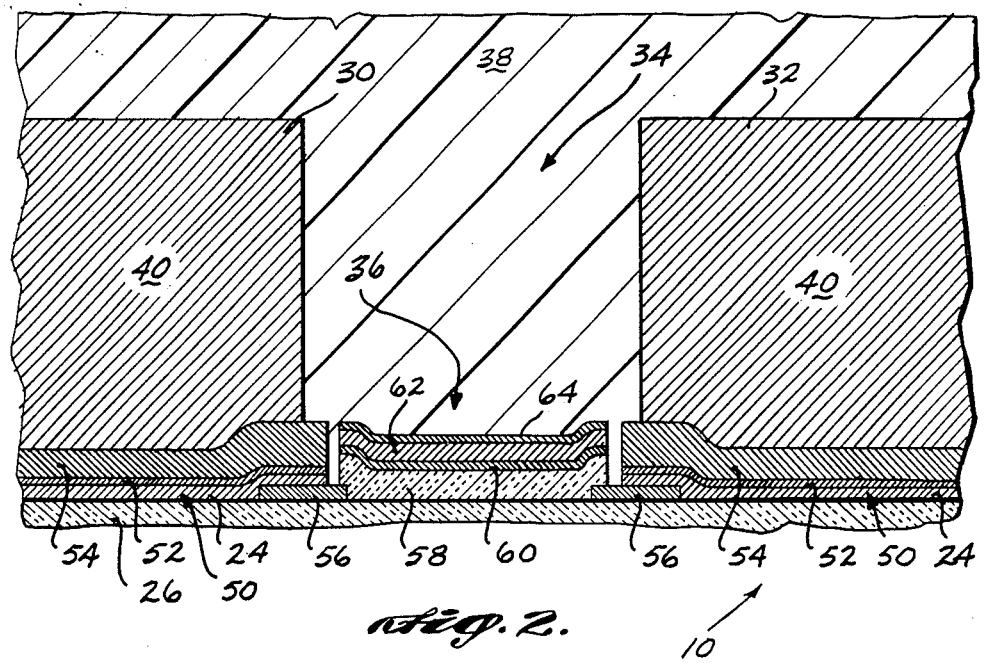
FIG. 2 is a elevational cross section of the structure for selectively providing electrical continuity.

Details of switchable connector 36 are shown in FIG. 2, illustrating in an exemplary fashion how each of the switchable connectors disposed in multi-chip module 10 are configured. First and second portions 30 and 32 of copper conductor 28 terminate on each side of gap 34, separated by switchable connector 36. Both first and second portions 30 and 32 comprise a layer of plated copper 40, applied to plating base 24. Plating base 24 includes a titanium layer 50, covered by a relatively thinner platinum layer 52, and a gold layer 54.

Plating base 24 terminates at each side of gap 34, at an intermediate point atop spacer pads 56. Spacer pads 56 are deposited on transparent dielectric layer 26, are electrically conductive, and preferably comprise titanium. Each of the layers comprising plating base 24 are sequentially vacuum deposited on transparent dielectric layer 26 (and on spacer pads 56) using conventional vacuum deposition techniques, and are patterned using a photolithographic mask, as is well known to those of ordinary skill in the art. Subsequently, plated copper 40 is electroplated on the plating base, again using well-known electroplating techniques in a photolithographically defined trench of a photosensitive material such as a photoresist or photosensitive polyimide mask to define the height and extent of first and second portions 30 and 32 of copper conductor 28.

Switchable connector 22 initially forms a nonconducting bridge across gap 34. The switchable connector comprises an amorphous silicon layer 58 having a typical thickness, in the preferred embodiment, of from 2,000 to 4,000 Angstroms. Amorphous silicon layer 58 is applied to transparent dielectric layer 26 using conventional vacuum deposition techniques. Thereafter, a barrier layer 60, preferably comprising titanium, is vacuum deposited on amorphous silicon layer 58. The material used for barrier layer 60 must not react with silicon or diffuse into it until heated above a predetermined reaction temperature. In the preferred embodiment, the predetermined reaction temperature is approximately 500° C.

A reactive metal layer 62 is applied over barrier layer 60; the barrier layer prevents the reactive metal layer from coming into direct physical contact with amorphous silicon layer 58. The reactive metal layer is characterized by its high conductivity and its readiness to react with silicon to form conductive silicides. In the preferred embodiment, reactive metal layer 62 comprises platinum; however, palladium, nickel, or a mixture of aluminum and silicon (for example 70% aluminum and 30% silicon) may also be used. Since these materials react with silicon at temperatures well below the 500° C. reaction temperature, barrier layer 60 is required to prevent reactive metal layer 62 from interacting with amorphous silicon layer 58 when multi-chip module substrate 10 is heated to a temperature of approximately 400° C. to cure the polyimide comprising insulating coating 38.

An antireflective coating 64 is applied to reactive metal layer 62 to minimize reflection of a laser beam that may be used to activate switchable connector 36, changing it from its nonconductive state to a conductive state. In the preferred embodiment, antireflective coating 64 preferably comprises a thin silicon layer. During the polyimide curing process, the silicon applied for use as antireflective coating 64 reacts with reactive metal layer 62, producing a relatively rough, nonreflective silicide surface. Alternatively, antireflective coating 64 may comprise other well-known materials having antireflective properties, for example, magnesium fluoride ($MgF_2$). Antireflective coating 64, reactive metal layer 62, barrier layer 60, and amorphous silicon layer 58 are all vacuum deposited and photolithographically defined using well-known, conventional techniques.

As shown in FIG. 2, switchable connector 36 is in its nonconducting state. Amorphous silicon layer 58 is in bridging contact between spacer pads 56, but does not readily conduct current because it is an amorphous semiconductor having a very high resistivity. Both barrier layer 60 and reactive metal layer 62 are conductive, but they are separated from electrical contact with adjacent plated copper 40 and spacer pad 56 by amorphous silicon layer 58. Accordingly, as shown in FIG. 2, virtually no electric current flows between first and second portions 30 and 32 of copper conductor 28 through switchable connector 36.

Figure 3:
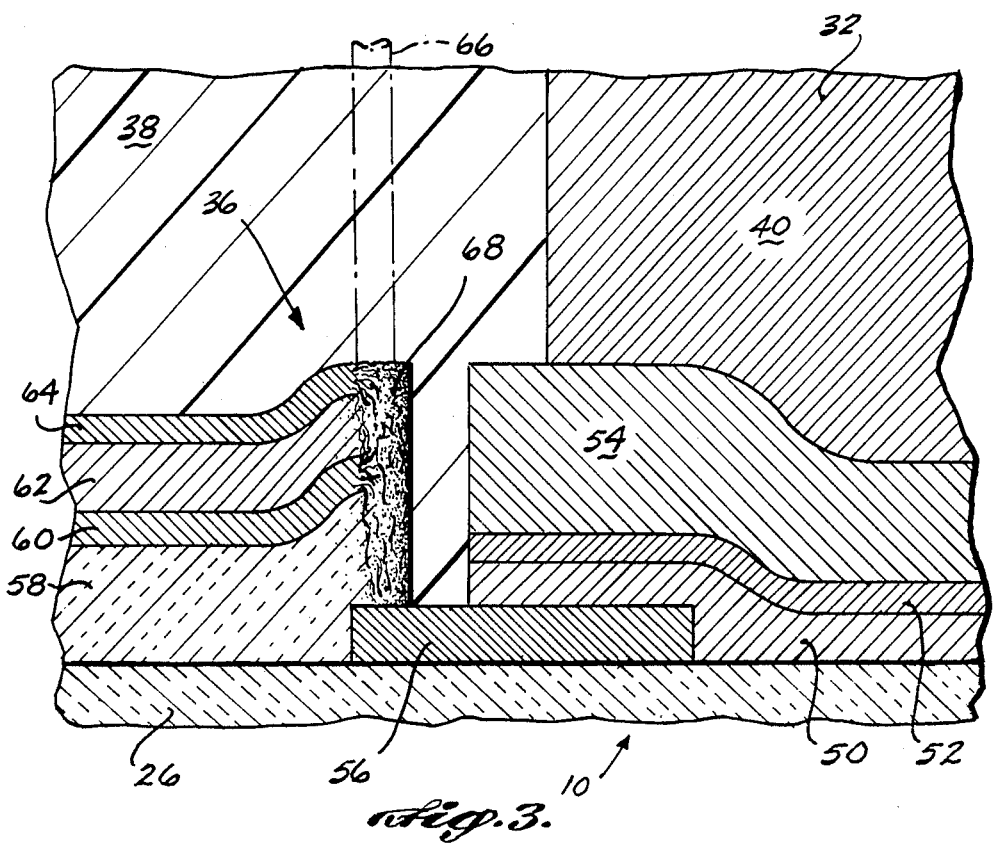
FIG. 3 is an elevational cross-sectional view of a portion of the structure for selectively providing electrical continuity, illustrating conversion of the structure from a nonconductive state to a conductive state using a focused laser beam.

In FIG. 3, a portion of the right side of FIG. 2 is enlarged to illustrate activation of switchable connector 36 using a laser beam 66. When it is desired to activate switchable connector 36, laser beam 66 is focused through the polyimide material comprising insulating coating 38, onto the edges of reactive metal layer 62 and barrier layer 60. Antireflective coating 64 absorbs most of the energy of laser beam 66 so that its heat transfers into the underlying structure. Laser beam 66 has sufficient energy to rapidly heat the barrier layer above the reaction temperature (i.e., above 500° C.) for a short time duration, causing it to diffuse into and react with amorphous silicon layer 58. In addition, as the titanium in barrier layer 60 forms titanium silicide, the platinum of reactive metal layer 62 also diffuses into and reacts with amorphous silicon layer 58, forming platinum silicide. It is interesting to note that platinum has a melting point in excess of 1400° C.; however, when exposed to silicon, it readily diffuses into the silicon and forms platinum silicide at a temperature of approximately 300° C.—a process characteristic of a eutectic reaction.

The diffusion of platinum and titanium and reaction of these materials with amorphous silicon layer 58 caused by the heat from laser beam 66 occurs in a region generally indicated at reference numeral 68 in FIG. 3. Although laser beam 66 can be scanned across the entire surface covered by antireflective coating 64 to cause reaction of substantially all the barrier layer and reactive metal layer with amorphous silicon layer 58, a conductive path between first and second portions 30 and 32 of copper conductor 28 can be produced simply by focusing laser beam 66 only on the opposite edges of barrier layer 60 and reactive metal layer 62, creating two conductive regions 68. Electric current may then flow from first portion 30 of copper conductor 28 through one region 68, and through the remainder of reactive metal layer 62 to the opposite edge of the switchable connector. At the opposite edge of the switchable connector, the electric current flows through the other region 68, and via spacer pad 56 and plating base 24 into second portion 32 of copper conductor 28.

Other focused energy beams, for example, an electron beam or an x-ray beam, may be used to heat barrier layer 60 and reactive metal layer 62 above the reaction temperature, so long as the switchable connector is not covered by an overlying insulating such as by polyimide, which would absorb the beam. A continuous wave argon laser is used in the preferred embodiment, since it has a wavelength to which the polyimide insulating coating 38 is essentially transparent. Alternatively, other insulating coatings selected for transparency to the wavelength of the focused energy beam employed could be used.

Because the focused laser beam can selectively activate one of the switchable connectors by heating only the opposite edges of the structure, there is no need to scan the laser beam back and forth across the entire area of the switchable connector. As a result, it takes less time to activate a switchable connector, and there is little likelihood that a different, adjacent switchable connector may be inadvertently activated. Incorrect activation of a switchable connector would likely ruin the multi-chip module substrate in which it is disposed, because the activation process is not reversible.

Switchable connectors fabricated as described above are not limited to use in multi-chip modules, but may also be used in other types of ICs to selectively connect components formed on the IC substrate. However, the processes used to fabricate such ICs must not exceed the reaction temperature of the switchable connectors.

While the present invention has been disclosed with respect to a preferred embodiment and modifications thereto, it will be apparent to those of ordinary skill in the art that further modifications may be made to the invention within the scope of the claims that follow. Accordingly, it is not intended that the scope of the invention be in any way limited by the disclosure of the preferred embodiment, but instead that it be determined entirely by reference to the claims.

The embodiments of the invention in which an exclusive property or privilege is claimed are defined as follows:

1. A method for selectively providing electrical continuity between two conductors in an integrated circuit, comprising the steps of:
   (a) forming a layer of silicon between the two conductors;
   (b) forming a barrier layer of a metallic material that is chemically nonreactive with silicon and does not diffusively mix with silicon below a substantially elevated reaction temperature, on the layer of silicon so that the barrier layer is prevented from electrically connecting to the two conductors by the silicon layer;
   (c) forming on the barrier layer, a layer of an electrically conductive material that is chemically reactive with silicon at a temperature substantially below the reaction temperature, so the electrically conductive material is separated from the layer of silicon; and
   (d) selectively heating a limited area of the substrate, including at least portions of the barrier layer and of the layer of electrically conductive material, above the reaction temperature, causing the electrically conductive material and the metallic material to react with the silicon, producing conductive silicides, thereby providing electrical continuity between the two conductors through the conductive silicides and the layer of electrically conductive material.

2. The method of claim 1, wherein the step of heating comprises the step of focusing an energy beam on portions of the barrier layer and the electrically conductive layer.

3. The method of claim 2, further comprising the step of forming an antireflective coating over the layer of electrically conductive material to absorb the focused beam of energy, preventing it being reflected.

4. The method of claim 2, wherein the focused beam of energy is a laser beam.

5. The method of claim 1, wherein the reaction temperature is substantially above 300° C.

6. The method of claim 1, wherein the electrically conductive material is selected from the group consisting of platinum, palladium, nickel, and aluminum, and a mixture of aluminum and silicon.

7. The method of claim 1, wherein the barrier layer comprises one or more selected from the group consisting of titanium, niobium, zirconium, and vanadium.

8. The method of claim 1, further comprising the step of depositing electrically conductive spacers on the substrate, each in electrical contact with one of the conductors and with the layer of silicon, said spacers providing electrical continuity between the two conductors and the conductive silicides.

9. The method of claim 1, further comprising the steps of applying an insulating coating on the layer of electrically conductive material, and curing the insulating coating at a temperature well below the reaction temperature.

10. The method of claim 9, wherein the insulating coating is transparent and comprises polyimide.

* * * * *